United States Patent [19]

Fabian

[11] Patent Number: 5,283,441
[45] Date of Patent: * Feb. 1, 1994

[54] LOW-POWER CURRENT MIRROR HAVING FEEDBACK WITH OPTICAL ISOLATION

[75] Inventor: Liboslav Fabian, New Brighton, Minn.

[73] Assignee: Empi, Inc., St. Paul, Minn.

[*] Notice: The portion of the term of this patent subsequent to Feb. 23, 2010 has been disclaimed.

[21] Appl. No.: 977,129

[22] Filed: Nov. 16, 1992

Related U.S. Application Data

[63] Continuation-in-part of Ser. No. 851,052, Mar. 13, 1992, Pat. No. 5,189,307.

[51] Int. Cl.[5] ............ G02B 27/00; H03K 3/42; A61N 1/30
[52] U.S. Cl. ............................ 250/551; 307/311; 604/20; 250/214 A
[58] Field of Search ............. 250/551, 214 A, 214 C, 250/214 SW, 214 R; 307/311; 604/20

[56] References Cited

U.S. PATENT DOCUMENTS

| | | | |
|---|---|---|---|
| 4,417,099 | 11/1983 | Pierce . | |
| 4,539,480 | 9/1985 | Artinano et al. . | |
| 4,596,048 | 6/1986 | Dunki-Jacobs . | |
| 4,629,901 | 12/1986 | Nishizawa | 250/551 |
| 4,649,302 | 3/1987 | Damiano et al. | 307/311 |
| 4,652,764 | 4/1987 | Nagano . | |
| 4,712,020 | 12/1987 | Basile | 250/551 |
| 4,739,174 | 4/1988 | Nagano . | |
| 4,825,351 | 4/1989 | Uesugi . | |
| 4,902,901 | 2/1990 | Pernyeszi . | |
| 5,043,587 | 8/1991 | Miki et al. | 250/551 |
| 5,089,948 | 2/1992 | Brown et al. . | |

FOREIGN PATENT DOCUMENTS

| | | | |
|---|---|---|---|
| 3513883.1 | 10/1986 | Fed. Rep. of Germany | 307/311 |
| 63-119334 | 5/1988 | Japan | 250/551 |
| 1524170 | 11/1989 | U.S.S.R. | 307/311 |
| 2002612 | 2/1979 | United Kingdom | 307/311 |

OTHER PUBLICATIONS

Williams, "Design Considerations for Optically Coupled Isolators", *Electronic Engineering*, vol. 48, No. 586, pp. 59-62, Dec. 1976.

Cirovic et al., *Electronic Devices, Circuits, and Systems*, 1987, p. 133.

Hamamatsu, product catalog, 1990, "Photocouplers", pp. 1-17.

Dionics, Inc. Data Book, ISO-GATE Device Applications (Mar. 1989) (Isolation Amplifier shown in lower right hand corner of page).

Siemens Data Book, IL300 Linear Optocouplers (April 1991).

*Primary Examiner*—Michael Messinger
*Attorney, Agent, or Firm*—Kinney & Lange

[57] ABSTRACT

An optically isolated current mirror provides an isolated output signal as a function of an input signal. The mirror includes first and second optical isolators and an amplifier. The amplifier is connected to the first and second optical isolators in a voltage follower configuration which supplies the output signal as a function of an isolated control signal and an isolated feedback signal. The first optical isolator is connected between a source of the input signal and the amplifier. The first optical isolator includes a photosensitive np junction which generates the isolated control signal as a function of the input signal. The second optical isolator is connected to the amplifier in a feedback loop. The second optical isolator includes a photosensitive np junction which generates the isolated feedback signal as a function of the output signal.

21 Claims, 4 Drawing Sheets

Fig. 5

LOW-POWER CURRENT MIRROR HAVING FEEDBACK WITH OPTICAL ISOLATION

CROSS-REFERENCE TO CO-PENDING APPLICATION

This application is a continuation-in-part of U.S. Ser. No. 07/851,052, filed Mar. 13, 1992 now U.S. Pat. No. 5,189,307.

BACKGROUND OF THE INVENTION

The present invention relates to an isolated signal source. In particular, the present invention relates to an optically isolated current mirror.

There is a need for analog signal isolation in a wide variety of electronic applications. Historically, transformers have been used to isolate alternating current (AC) signals. For direct current (DC) applications, direct current signals have been isolated by first modulating the DC signal with an AC signal, then isolating the AC signal with a transformer and finally demodulating the DC signal from the AC signal.

The use of a transformer to perform the isolation has several disadvantages for DC applications. First, isolation transformers are relatively large and expensive. Second, modulating and then demodulating the DC signal requires complex circuitry which adds the size and expense of the isolation circuit. Finally, isolation transformers require a separate power supply for each side of the isolation barrier. This increases the power consumption of the isolation circuit.

Recently, circuit designers have started using optical devices for isolation. These designs, however, have been complex and have required a power supply on each side of the isolation barrier. Further, optical isolators have transfer ratios with relatively high temperature coefficients. This reduces the accuracy of the isolated signal and the effectiveness of the overall isolation circuit.

SUMMARY OF THE INVENTION

The present invention provides an isolated signal source for generating an isolated output signal as a function of an input signal. The isolated signal source includes a source of the input signal, an amplifier and first and second optical isolators. The amplifier has first and second control terminals and an output terminal. The amplifier generates the output signal on the output terminal as a function of an isolated control signal and an isolated feedback signal. The first optical isolator is connected between the input signal source and the first amplifier control terminal for generating the control signal as a function of the input signal. The second optical isolator is connected between the amplifier output terminal and the second amplifier control terminal for generating the feedback signal as a function of the output signal.

First and second supply terminals are connected cross the amplifier. A first bias resistor is connected between the first amplifier control terminal and the second supply terminal. A second bias resistor is connected between the second amplifier control terminal and the second supply terminal.

In one embodiment, the amplifier, the first and second resistors and the first and second optical isolators are connected together in a voltage follower configuration such that the output signal follows the input signal. The amplifier controls the current through its output terminal to maintain equal voltages at its control terminals.

If the transfer ratios of the first and second optical isolators are equal and the resistance values of the first and second bias resistors are equal, then the output signal will be substantially equal to the input signal. A trimmer resistor can be connected in series with the second resistor to compensate for any variation in the transfer ratios of the first and second optical isolators.

Preferably, the first and second optical isolators have substantially the same temperature coefficients. This can be achieved by selecting optical isolators from the same fabrication substrate or lot. By placing the second optical isolator in the feedback loop of the amplifier, the relatively high temperature coefficients of the optical isolators cancel one another such that the overall temperature coefficient of the circuit is negligible.

In one embodiment, the first and second optocouplers each include an input light-emitting diode and an output phototransistor. The input diode of the first optical isolator receives the input current and transmits an infrared signal which energizes the phototransistor. The phototransistor conducts current as a function of the input current within its operating limits. The current flowing through the emitter of the phototransistor is passed through the first resistor to provide a control voltage at the first amplifier control terminal.

The input diode of the second optical isolator is connected to the amplifier output terminal for receiving the output current. The input diode transmits an infrared signal to the phototransistor. The phototransistor of the second optical isolator conducts current as a function of the output current within its operating limits. The current flowing through the emitter of the phototransistor is passed through the second resistor to provide a feedback voltage at the second amplifier control terminal.

In an alternative embodiment, the current flowing through the bases of the phototransistors are passed through the first and second resistors to provide the isolated control voltage and feedback voltage, respectively. This substantially reduces the power consumption of the isolated signal source since the base currents of the phototransistors are much lower than the emitter currents.

In another alternative embodiment, the first and second optical isolators include output phototransistors connected in a Darlington configuration. In another alternative embodiment, the first and second optical isolators include a photovoltaic output formed by a plurality of series-connected silicon pn junctions. In this embodiment, the outputs of the first and second isolators are connected in parallel across the first and second resistors, respectively.

The isolated signal source of the present invention has a relatively simplistic circuit design which employs commonly available, inexpensive parts. A significant advantage of the isolation scheme of the present invention is that there is no need for a separate power supply on the input side of the circuit to sense the input current. The light-emitting diode transfers energy directly from the input current to the output side of the circuit. Only a single power supply is required to drive the amplifier and transistors in the output side of the circuit. As a result, the power consumption of the isolation circuit is lower than isolation circuits of the prior art. Further, the isolation circuit is relatively insensitive to variations in temperature. High temperature coefficients have traditionally reduced the effectiveness of using optical isolators in circuits of the prior art.

DETAILED DESCRIPTION OF THE PREFERRED EMBODIMENTS

The isolated current mirror of the present invention provides an isolated output current which is a function of an input current. A first optical isolator generates an isolated control signal which is a function of the input current. An amplifier is connected to the first optical isolator and generates an output current as a function of the isolated control signal and an isolated feedback signal. A second optical isolator is connected to the amplifier in a feedback loop and generates the isolated feedback signal as a function of the output current. The amplifier is connected in a voltage follower configuration to mirror the input current into the output current, irrespective of the temperature coefficients of the optical isolators.

Figure 1:
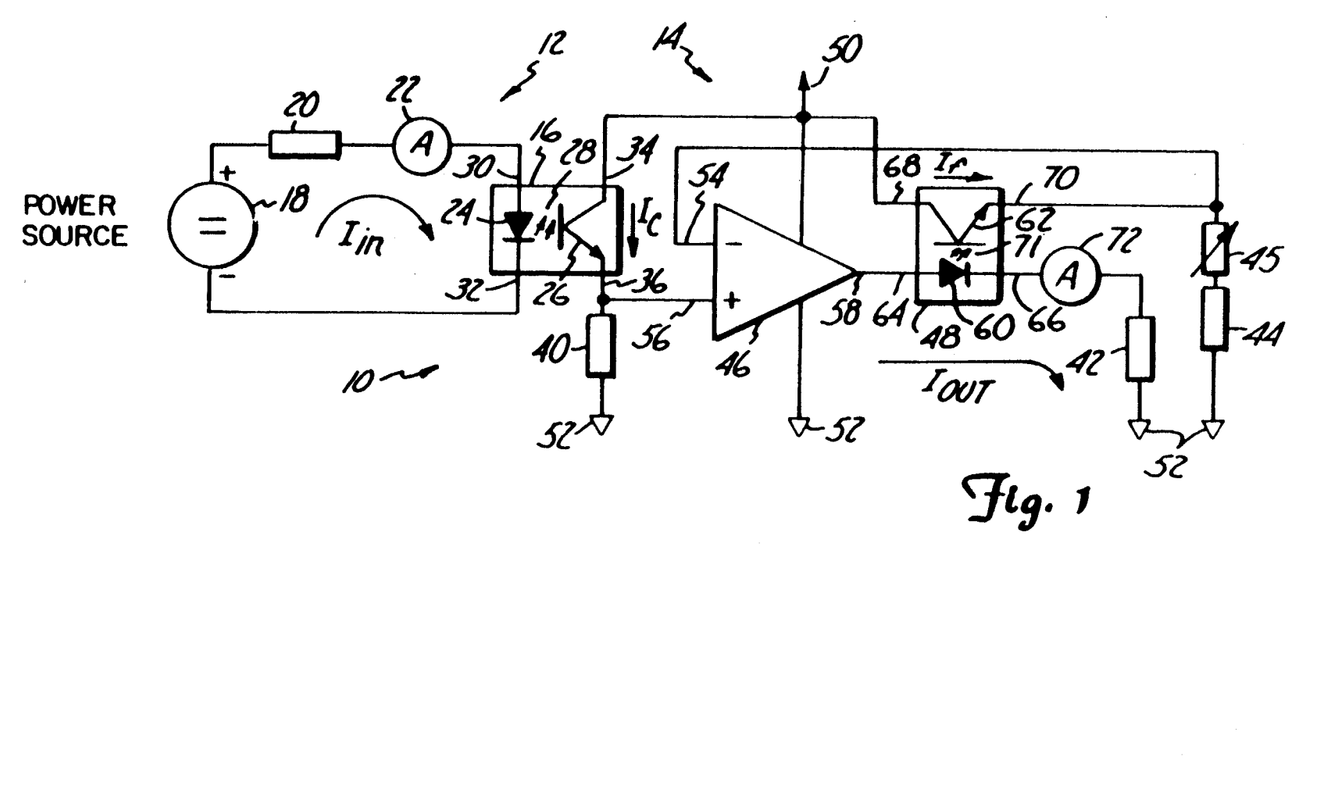
FIG. 1 is a schematic diagram of an isolated signal source with a pair of phototransistor optocouplers, in accordance with the present invention.

FIG. 1 is a schematic diagram of an optically isolated current mirror 10, in accordance with the present invention. Current mirror 10 generates an isolated output current $I_{out}$ which is equal to an input current $I_{in}$. Current mirror 10 includes an input circuit 12 and an output circuit 14. Input circuit 12 and output circuit 14 are electrically isolated from one another by an optical isolator 16.

Input circuit 12 includes an input circuit power source 18 and a circuit resistance 20. Circuit resistance 20 is connected in series with power source 18. Power source 18 generates input current $I_{in}$ through circuit resistance 20. An ampere meter 22 may be connected in series with input circuit 12 to measure input current $I_{in}$.

In the embodiment shown in FIG. 1, optical isolator 16 includes a light-emitting diode (LED) 24 and a phototransistor 26. LED 24 is connected in series with input circuit 12 to receive input current $I_{in}$. LED 24 is optically coupled to, but electrically isolated from, phototransistor 26. LED 24 emits an infrared signal 28 which energizes phototransistor 26.

Optical isolator 16 includes input terminals 30 and 32 and output terminals 34 and 36. The anode of LED 24 is connected to input terminal 30. The cathode of LED 24 is connected to input terminal 32. The collector of phototransistor 26 is electrically connected to output terminal 34. The emitter of phototransistor 26 is electrically connected to output terminal 36. The collector and emitter of phototransistor 26 define a control current path $I_c$ which is a function of input current $I_{in}$. The magnitude of control current $I_c$ depends upon the transfer ratio and temperature coefficient of optical isolator 16. A typical transfer ratio is one to one.

Output circuit 14 includes bias resistors 40, 42, 44 and 45, an amplifier 46, an optical isolator 48 and power supply terminals 50 and 52. In the embodiment shown in FIG. 1, amplifier 46 is an operation amplifier. Amplifier 46 is connected between supply terminals 50 and 52. Amplifier 46 includes an inverting input terminal 54, a noninverting input terminal 56 and an output terminal 58. Noninverting input terminal 56 is connected to optical isolator output terminal 36 and to resistor 40. Resistor 40 is connected between noninverting input terminal 56 and supply terminal 52. Optical isolator output terminal 34 is connected to supply terminal 50.

Optical isolator 48 is connected in a feedback loop of amplifier 46 between amplifier output terminal 58 and inverting amplifier input terminal 54. Optical isolator 48 includes a light-emitting diode (LED) 60, a phototransistor 62, input terminals 64 and 66 and output terminals 68 and 70. Optical isolator input terminal 64 is connected to amplifier output terminal 58 to receive an output current $I_{out}$ from amplifier 46. LED 60 emits an infrared signal 71 which energizes phototransistor 62 to generate a feedback current $I_f$ which is a function of output current $I_{out}$.

The anode of LED 60 is connected to input terminal 64. The cathode of LED 60 is connected to input terminal 66 The collector of phototransistor 62 is connected to output terminal 68. The emitter of phototransistor 62 is connected to output terminal 70. The collector and emitter of phototransistor 62 define a current path for feedback current $I_f$. The magnitude of feedback current $I_f$ depends upon the magnitude of output current $I_{out}$ and the transfer ratio and temperature coefficient of optical isolator 48.

An ampere meter 72 can be connected in series with optical isolator output terminal 66 to monitor output current $I_{out}$. Resistor 42 is connected between ampere meter 72 and supply terminal 52. Resistor 42 represents a circuit load on output current $I_{out}$.

Optical isolator output terminal 68 is connected to supply terminal 50. Output terminal 70 is connected to inverting amplifier input terminal 54. Resistor 44 is connected between inverting amplifier input terminal 54 and supply terminal 52. Variable trimmer resistor 45 can be connected in series with resistor 44 to compensate for any differences in the transfer ratios of optical isolators 16 and 48.

Resistor 44 converts feedback current $I_f$ into a feedback voltage on inverting input terminal 54. Similarly, resistor 40 converts control current $I_c$ into a control voltage on noninverting input terminal 56. Amplifier 46 is connected in a voltage follower configuration which generates the output current $I_{out}$ as a function of the control voltage on noninverting input terminal 56 and the feedback voltage on inverting input terminal 54.

In operation, output current $I_{out}$ follows input current $I_{in}$. Amplifier 46 controls output current $I_{out}$ to maintain the control voltage and the feedback voltage on its inverting and noninverting input terminals 54 and 56 substantially the same. If the control voltage and the feedback voltage are the same and resistors 40 and 44 (and 45) are the same, then the control current $I_c$ and the feedback current $I_f$ are the same. If the transfer ratios of optical isolators 16 and 48 are the same, then the output current $I_{out}$ and the input current $I_{in}$ will be the same. Therefore, isolated signal source 10 mirrors input current $I_{in}$ in the isolated output current $I_{out}$.

A common disadvantage of using optical devices for isolation is that the optical devices have a relatively high temperature coefficient which causes the transfer ratio to vary with temperature. However, the optically isolated signal source shown in FIG. 1 is relatively insensitive to temperature. In a preferred embodiment, optical isolators 16 and 48 are fabricated on the same substrate or the same lot so they have substantially the same temperature coefficients and transfer ratios. Similarly, resistors 40 and 44 preferably have the same resistances and temperature coefficients. The temperature coefficient of the overall circuit is negligible because the transfer ratios cancel one another with the feedback configuration of the present invention. Therefore, output current $I_{out}$ is substantially equal to input current $I_{in}$, regardless of temperature.

Isolated signal source 10 has a relatively simplistic circuit design and contains relatively inexpensive parts which are commercially available. A major advantage of the isolated signal source of the present invention is that an additional power supply is not required in the input circuit to sense the input current $I_{in}$. Only a single power supply is required in the circuit to drive phototransistors 26 and 62 and operational amplifier 46.

Figure 2:
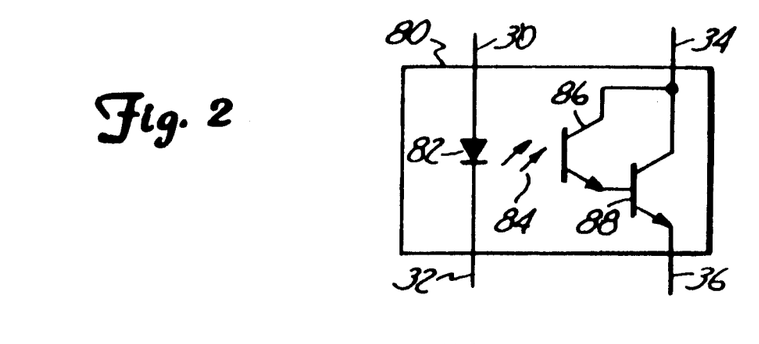
FIG. 2 is a schematic diagram of an alternative optocoupler which can be used in the isolated signal source shown in FIG. 1.

Other types of optical isolators can also be used with the present invention. For example, FIG. 2 illustrates a Darlington-connected optical isolator 80 which can be used in replace of optical isolators 16 and 48 shown in FIG. 1. Optical isolators such as those shown in FIGS. 1 and 2 are also referred to as "optoisolators", "optocouplers" and "photocouplers", for example.

Similar to isolators 16 and 48, optical isolator 80 includes input terminals 30 and 32 and output terminals 34 and 36. Optical isolator 80 further includes a light-emitting diode (LED) 82 having an anode which in connected to input terminal 30 and a cathode which is connected input terminal 32. A phototransistor 86 is connected in Darlington-configuration with a transistor 88. The collectors of transistors 86 and 88 are connected to output terminal 34. The emitter of transistor 86 is connected to the base of transistor 88. The emitter of transistor 88 is connected to output terminal 36. LED 82 emits an infrared signal 84 which energizes phototransistor 86.

Figure 3:
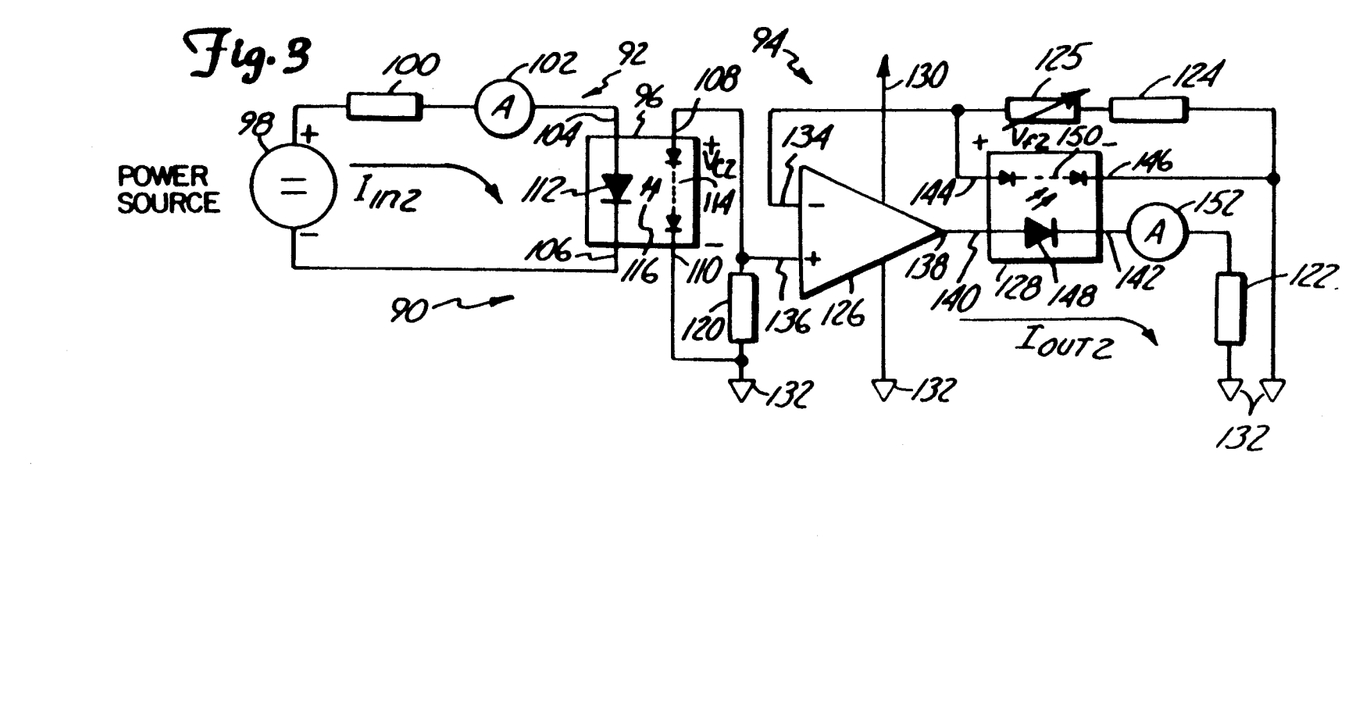
FIG. 3 is a schematic diagram of an isolated signal source having a pair of photovoltaic optical isolators, in accordance with the present invention.

FIG. 3 is schematic diagram of an isolated signal source having a pair of photovoltaic isolators, in accordance with the present invention. Isolated signal source 90 includes an input circuit 92 and an output circuit 94 which are separated by a photovoltaic isolator 96. Input circuit 92 includes a power source 98 and a circuit resistance 100. Power source 92 generates an input current $I_{in2}$ through circuit resistance 100. An ampere meter 102 can be connected in series with power source 98 and circuit resistance 100 to monitor input current $I_{in2}$.

Photovoltaic isolator 96 includes input terminals 104 and 106, output terminals 108 and 110, a light-emitting diode (LED) 112 and a plurality of silicon pn junctions 114. The anode of LED 112 is connected to input terminal 104. The cathode of LED 112 is connected to input terminal 106. The plurality of silicon pn junctions 114 are connected in series between output 108 and 110.

LED 112 is connected in series with input circuit 92 to receive input current $I_{in2}$. LED 112 is optically coupled to, but electrically isolated from pn junctions 114. LED 112 transmits an infrared signal 116 which energizes, by photovoltaic action, the plurality of pn junctions 114. The energy transmitted by LED 112 directly generates an output control voltage $V_{c2}$ across isolator output terminals 108 and 110 which is a function of input current $I_{in2}$. A separate power supply is not required to generate output voltage $V_{c2}$.

The current flowing through the plurality of pn junctions 114 is substantially smaller than the current flowing through phototransistor 28, shown in FIG. 1. This translates into less power consumption in the photovoltaic version shown in FIG. 3 than in the phototransistor version shown in FIG. 1.

Output circuit 94 includes bias resistors 120, 122, 124 and 125, amplifier 126, photovoltaic isolator 128 and supply terminals 130 and 132. Resistor 120 is connected in parallel across isolator output terminals 108 and 110. Amplifier 126 is connected between supply terminals 130 and 132. Amplifier 126 includes inverting input terminal 134, noninverting input terminal 136 and output terminal 138. Noninverting input terminal 136 is connected to isolator output terminal 108 for receiving the control voltage $V_{c2}$.

Photovoltaic isolator 128 is connected in a feedback loop of amplifier 126 between amplifier output terminal 138 and inverting amplifier input terminal 134. Photovoltaic isolator 128 includes input terminals 140 and 142, output terminals 144 and 146, a light-emitting diode (LED) 158 and a plurality of pn junctions 150. LED 148 has an anode which is connected to input terminal 140 and a cathode which is connected to input terminal 142. The plurality of pn junctions 150 are connected in series between output terminals 144 and 146.

Isolator input terminal 140 is connected to amplifier output terminal 138 to receive output current $I_{out2}$. Resistor 124 is connected in parallel across isolator output terminals 144 and 146. Variable trimmer resistor 125 can be connected in series with resistor 124 to compensate for any variation in the transfer ratios of isolators 96 and 128. Isolator output terminal 144 is connected to amplifier inverting input 134. Isolator output terminal 146 is connected to supply terminal 132.

Photovoltaic isolator 128 generates a feedback voltage $V_{f2}$ which is a function output current $I_{out2}$. Feedback voltage $V_{f2}$ is applied to inverting amplifier input terminal 134. Amplifier 126 generates output current $I_{out2}$ as a function of control voltage $V_{c2}$ and feedback voltage $V_{f2}$. An ampere meter 152 can be connected in series with isolator output 142 to monitor output current $I_{out2}$. Resistor 122 is connected in series between ampere meter 152 and supply terminal 132. Resistor 122 represents a circuit load on output current $I_{out2}$.

Output current $I_{out2}$ will be substantially equal to input current $I_{in2}$, provided photovoltaic isolators 96 and 128 have the same transfer ratios and temperature coefficients and resistors 120 and 124 (and 125) have the same resistance values. Amplifier 126 drives output current $I_{out2}$ to a level sufficient to maintain substantially the same voltages at its input terminals 134 and 136. If feedback voltage $V_{f2}$ is equal to control voltage $V_{c2}$ and the transfer ratios of photovoltaic isolators 96 and 128 are the same, then output current $I_{out2}$ will be the same as input current $I_{in2}$.

The optical current mirror of the present invention is simplistic, inexpensive and relatively insensitive to temperature. The circuit does not require a power supply on the input side of the isolation barrier to sense the input current. In the photovoltaic version shown in FIG. 3, the isolator directly transforms the input current into an isolated output voltage without requiring a separate power supply to generate the output voltage. The photovoltaic version consumes even less power than the phototransistor versions shown in FIGS. 1 and 2.

The optically isolated current mirror of the present invention uses electrical components which are commercially available. Examples of diode-phototransistor optical isolators which can be used in the embodiment shown in FIG. 1 include a PC817 series photocoupler, manufactured by Sharp, and a 4N25, manufactured by Texas Instruments Incorporated. An example of a photovoltaic isolator which can be used in the embodiment shown in FIG. 3 is a PV15100, manufactured by International Rectifier. Other optical isolators can also be used with the present invention.

Figure 4:
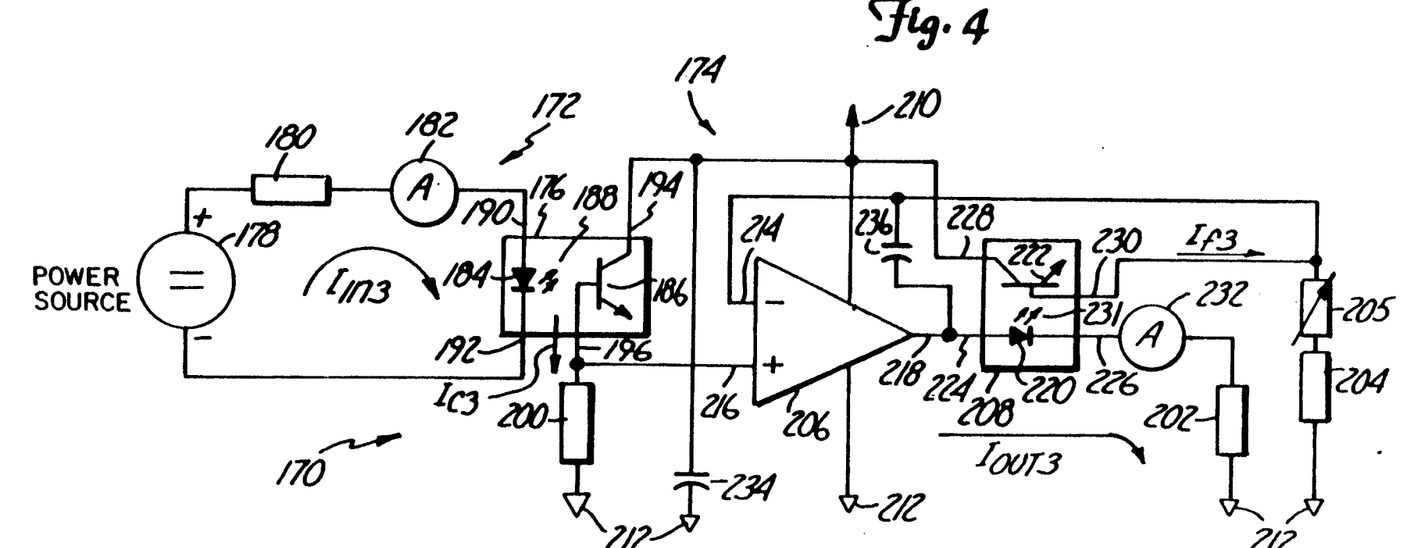
FIG. 4 is a schematic diagram of an alternative, low-power embodiment of the isolated signal source shown in FIG. 1.

FIG. 4 is a schematic diagram of an alternative, low-power optically isolated current mirror 170, in accordance with the present invention. Current mirror 170 is substantially similar to current mirror 10, shown in FIG. 1. Current mirror 170 generates an isolated output current $I_{out3}$ which is equal to an input current $I_{in3}$. However, the base currents of the phototransistors in the optical isolators are used to generate the control and feedback currents for the amplifier. In the embodiment shown in FIG. 1, the emitter currents are used to generate the control and feedback currents. The embodiment shown in FIG. 4 substantially reduces the power consumption of current mirror 170 since the base currents are much lower than the emitter currents.

Current mirror 170 includes an input circuit 172 and an output circuit 174. Input circuit 172 and output circuit 174 are electrically isolated from one another by an optical isolator 176. Input circuit 172 includes an input circuit power source 178 and a circuit resistance 180. Circuit resistance 180 is connected in series with power source 178. Power source 178 generates input current $I_{in3}$ through circuit resistance 180. An ampere meter 182 may be connected in series with input circuit 172 to measure input current $I_{in3}$.

In the embodiment shown in FIG. 4, optical isolator 176 includes a light-emitting diode (LED) 184 and a phototransistor 186. LED 184 is connected in series with input circuit 172 to receive input current $I_{in3}$. LED 184 is optically coupled to, but electrically isolated from, phototransistor 186. LED 184 emits infrared signals 188 which energize phototransistor 186.

Optical isolator 176 includes input terminals 190 and 192 and output terminals 194 and 196. The anode of LED 184 is connected to input terminal 190. The cathode of LED 184 is connected to input terminal 192. The collector of phototransistor 186 is electrically connected to output terminal 194. The base of phototransistor 186 is electrically connected to output terminal 196. The emitter of phototransistor 16 is unconnected. The collector-base junction of phototransistor 186 is a photosensitive semiconductor np junction which is reverse biased. Infrared signals 188 generate an isolated photo-control current $I_{c3}$ in the np junction which is a function of input current $I_{in3}$.

In an alternative embodiment, not shown, phototransistor 186 is replaced by a photodiode having a reverse biased np junction. Siemens manufactures an IL300 diode-to-diode optocoupler which can be used with the present invention.

The magnitude of photo-control current $I_{c3}$ depends upon the transfer ratio and temperature coefficient of optical isolator 176 and the beta of phototransistor 186. Since the base current is used to generate photo-control current $I_{c3}$, the power consumed by optical isolator 176 is negligible. For example, if input current $I_{in3}$ is 1.0 milliamperes, then photo-control current $I_{c3}$ may be only 1.2 microamperes.

Output circuit 174 includes bias resistors 200, 202, 204 and 205, an amplifier 206, an optical isolator 208 and power supply terminals 210 and 212. Amplifier 206 is an operational amplifier, such as an LM358 which is manufactured by National Semiconductor Corporation. Amplifier 206 is connected between supply terminals 210 and 212. Amplifier 206 includes an inverting input terminal 214, a non-inverting input terminal 216 and an output terminal 218. Non-inverting input terminal 216 is connected to optical isolator output terminal 196 and to resistor 200. Resistor 200 is connected between non-inverting input terminal 216 and supply terminal 212. In one embodiment resistor 200 is a 100 K ohm resistor.

Optical isolator output terminal 194 is connected to supply terminal 50. A filter capacitor 234 can be connected between supply terminals 210 and 212 to remove noise on the supply terminals. In one embodiment, capacitor 234 is a 10 microfarad capacitor.

Optical isolator 208 is connected in a feedback loop of amplifier 206 between amplifier output terminal 218 and inverting amplifier input terminal 214. A capacitor 236 can be connected between amplifier output terminal 218 and inverting input terminal 214 to reduce the tendency of amplifier 206 to oscillate. In one embodiment, capacitor 236 is a 0.001 microfarad capacitor. Optical isolator 208 includes a light-emitting diode (LED) 220, a phototransistor 222, input terminals 224 and 226 and output terminals 228 and 230. The anode of LED 220 is connected to input terminal 224. The cathode of LED 220 is connected to input terminal 226. The collector of phototransistors 222 is connected to output terminal 228. The base of phototransistor 222 is connected to output terminal 230. Optical isolator input terminal 224 is connected to amplifier output terminal 218 to receive output current $I_{out3}$ from amplifier 206.

LED 220 emits infrared signals 231 which energize phototransistor 222 to generate an isolated photo-feedback current $I_{f3}$ through its base which is a function of output current $I_{out3}$. The magnitude of feedback current $I_{f3}$ depends upon the magnitude of output current $I_{out3}$ and the transfer ratio and temperature coefficient of optical isolator 208. The collector-base junction of phototransistor 222 is a photosensitive semiconductor np junction which is reverse biased. Optical isolator 208 can also be replaced with a diode-to-diode optocoupler, similar to optical isolator 176.

Optical isolator output terminal 228 is connected to supply terminal 210. Output terminal 230 is connected to inverting amplifier input terminal 214. Resistor 204 is connected between inverting amplifier input terminal 214 and supply terminal 212. Variable trimmer resistor 205 can be connected in series with resistor 204 to compensate for any differences in the transfer ratios of optical isolators 176 and 208. In one embodiment, resistor 204 is a 75 k-ohm resistor and resistor 205 is a 50 k-ohm variable resistor.

Resistor 204 converts photo-feedback current $I_{f3}$ into a feedback voltage on inverting input terminal 214. Similarly, resistor 200 converts photo-control current $I_{c3}$ into a control voltage on non-inverting input terminal 216. Amplifier 206 is connected in a voltage follower configuration which generates output current $I_{out3}$ as a function of the control voltage on non-inverting input terminal 216 and the feedback voltage on inverting input terminal 214.

An ampere meter 232 can be connected in series with optical isolator output terminal 226 to monitor output current $I_{out3}$. Resistor 202 is connected between ampere meter 232 and supply terminal 212. Resistor 202 represents a circuit load on output current $I_{out3}$.

In operation, output current $I_{out3}$ follows input current $I_{in3}$. Amplifier 206 controls output current $I_{out3}$ to maintain the control voltage and the feedback voltage on its inverting and non-inverting input terminals 214 and 216 substantially the same. If the control voltage and the feedback voltage are the same and the values of resistors 200 and 204 (and 205) are the same, then photo-control current $I_{c3}$ and photo-feedback current $I_{f3}$ are the same. If the transfer ratios of optical isolators 176 and 208 are the same, then output current $I_{out3}$ and input current $I_{in3}$ will be the same. Therefore, isolated signal source 170 mirrors input current $I_{in3}$ into isolated output current $I_{out3}$.

Since the base currents of the phototransistors in optical isolators 176 and 208 are very small, input current $I_{in3}$ is repeated only once into output current $I_{out3}$. In the embodiment shown in FIG. 1, input current $I_{in}$ is repeated three times into photo-control current $I_c$, photo-feedback current $I_f$, and output current $I_{out}$. Therefore, the embodiment shown in FIG. 4 consumes substantially less power than the embodiment shown in FIG. 1.

Figure 5:
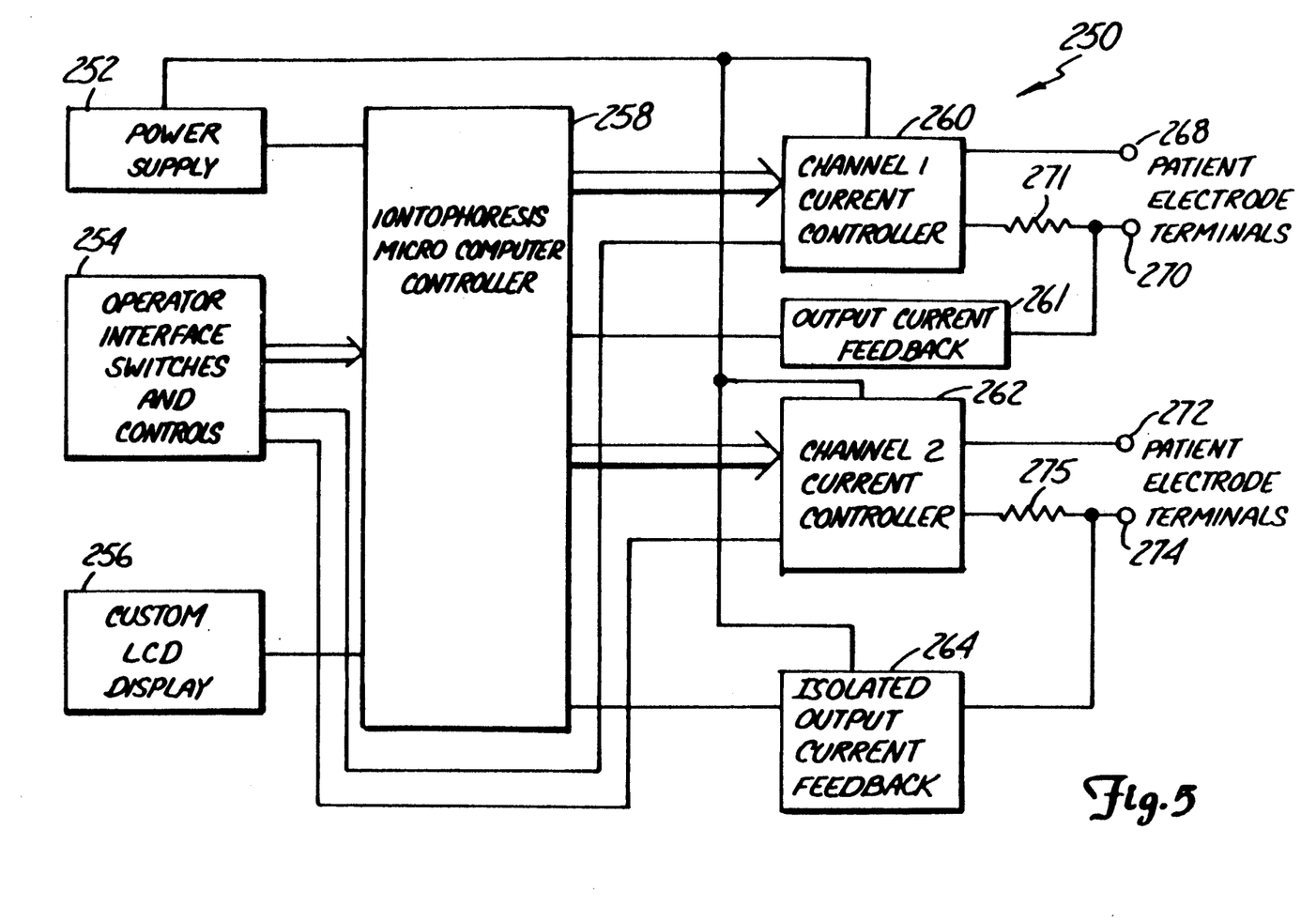
FIG. 5 is a block diagram of a multiple site iontophoresis device which incorporates the isolated signal source of the present invention.

The present invention can be used in a wide variety of applications which include, but are not limited to, multiple-site medical iontophoresis and transcutaneous electrical nerve stimulation. FIG. 5 is a block diagram of a multiple-site iontophoresis device which incorporates the isolated signal source of the present invention. Multiple-site iontophoresis device 250 includes power supply 252, operator interface switches and controls 254, custom LCD display 256, iontophoresis microcomputer controller 258, channel 1 current controller 260, output current feedback circuit 261, channel 2 current controller 262, isolated output current feedback circuit 264, channel patient electrode terminals 268 and 270, current sensing resistor 271, and channel 2 patient electrode terminals 272 and 274 and current sensing resistor 275.

Power supply 252 is connected to controller 258, channel 1 current controller 260, output current feedback circuit 261, channel 2 current controller 262, and isolated output current feedback circuit 264. Operator interface switches and controls 254 are connected to controller 258, channel current controller 260 and channel 2 current controller 262. Custom LCD display 256 is connected to controller 258. Controller 258 is connected to channel current controller 260, output current feedback circuit 261, channel 2 current controller 262, and output current feedback circuit 264.

Channel 1 current controller 260 is connected between controller 258 and channel 1 patient electrode terminals 268 and 270. Current sensing resistor 271 is connected in series with patient electrode terminal 271 to sense the output current delivered to the patient by channel 1 current controller 260. Output current feedback circuit 261 is connected in a feedback loop between channel 1 patient electrode terminals 268 and 270 and controller 258. Channel 2 current controller 262 is connected between controller 258 and channel 2 patient electrode terminals 272 and 274. Current sensing resistor 275 is connected in series with patient electrode terminal 274 to sense the output current delivered to the patient by channel 2 current controller 262. Output current feedback circuit 264 is connected in a feedback loop between channel 2 patient electrode terminals 272 and 274 and controller 258.

In medical iontophoresis, ionic drugs are transferred through a patient's skin by applying a DC current to a pair of electrodes attached to the patient's skin. One of the electrodes in the pair is an "active" electrode containing a drug solution. The other electrode is a "return" electrode. The iontophoresis system shown in FIG. 5 is a dual channel system. One electrode pair is attached to channel 1 electrode terminals 268 and 270. Another electrode pair is attached to channel 2 electrode terminals 272 and 274. Each pair of electrodes is driven by a separate driver channel. The channels are electrically isolated from each other. Channel 2 current controller 262 includes a transformer for driving electrode terminals 272 and 274. The transformer and the isolated output current feedback circuit 264 isolate channel 2 electrode terminals 272 and 274 from controller 258 and the rest of the circuitry.

Operator interface 254 includes several inputs that are used by the patient to control the infusion of ionic drugs through the electrode pairs during a treatment period. These inputs include a treatment dosage (in milliampere-minutes), an operational mode selection and a display selection. Iontophoresis device 250 operates in a set-up mode, a pause mode and a run mode. In the set-up mode, the patient enters a prescribed dosage in milliampere-minutes. Each channel is programmed independently. First, the patient selects channel set-up mode and then programs channel Second, the patient selects channel 2 set-up mode and programs channel 2. Custom LCD display 256 displays the appropriate channel parameters during set up.

During pause mode, controller 258 "powers up" each channel. Shunt circuitry within channel 1 current controller 260 and channel 2 current controller 262 reroutes current flow away from each electrode pair so that the current intensity can be adjusted before any current is delivered to the patient. Controller 258 monitors the current intensity for each electrode pair by monitoring feedback signals provided by feedback circuits 261 and 264. The current intensity for each channel is displayed on custom LCD display 256.

When the patient switches controller 258 from pause mode to run mode, the controller disables the shunt circuitry and operates each electrode driver channel to deliver the selected current intensity for a treatment period as determined from the resulting current intensity and the dosage parameters supplied by the patient. Controller 258 monitors the feedback signals for each channel and maintains a total count of milliampere-minutes delivered to the patient.

Each feedback circuit is electrically isolated from the other feedback circuits. For example, output current feedback circuits 261 and 264 can each include a low power, optically isolated current mirror of the present invention, as shown in FIGS. 1-4. In the dual channel device shown on FIG. 5, only one of the feedback circuits requires isolation to sufficiently isolate the feedback signal for channel 1 from the feedback signal for channel 2. This reduces the number components and the power consumption of multiple-site iontophoresis device 250.

In the device shown in FIG. 5, only output current feedback circuit 264 includes isolation. The optically isolated current mirror within feedback circuit 264 generates the feedback signal for channel 2 as a function of the output current delivered to the patient by channel 2.

The feedback signal for channel 2 is applied to controller 258. The optical isolation provides controller 258 with a more accurate representation of the output current delivered to the patient through each pair of electrodes, which allows a more accurate control of the drug dose delivered through each pair of electrodes.

The dual channel iontophoresis system shown in FIG. 5 is manufactured and marketed by Empi, Inc., under the trademark DUPEL. The system shown in FIG. 5 is discussed in greater detail in co-pending application Williams et al. U.S. Ser. No. 07/649,495, filed Feb. 1, 1991.

Although the present invention has been described with reference to preferred embodiments, workers skilled in the art will recognize that changes may be made in form and detail without departing from the spirit and scope of the invention. For example, a variety of optical isolators and amplifiers can be used with the present invention. Further, other biasing schemes can be used without departing from the scope of the invention. The present invention can be used in a wide variety of applications in addition to medical iontophoresis and transcutaneous electrical nerve stimulation.

What is claimed is:

1. An isolated source for providing an output signal as a function of an input signal, the source comprising:
   a source of the input signal;
   a first optical isolator connected to the input signal source and having a first photosensitive np junction which generates an isolated photo-control signal as a function of the input signal;
   an amplifier having first and second control terminals and an output terminal, with the first control terminal coupled to the first optical isolator, wherein the amplifier supplies the output signal on the output terminal as a function of the isolated photo-control signal and an isolated photo-feedback signal; and
   a second optical isolator coupled between the amplifier output terminal and the second amplifier control terminal and having a second photosensitive np junction which generates the isolated photo-feedback signal as a function of the output signal.

2. The isolated signal source of claim 1 wherein: the first optical isolator includes first a light-emitting diode connected to the input signal source for generating a first infrared signal to energize the first photosensitive np junction in response to the input signal; and
   the second optical isolator includes a second light-emitting diode connected to the amplifier output terminal for generating a second infrared signal to energize the second photosensitive np junction in response to the output signal.

3. The isolated signal source of claim 1 wherein the first and second photosensitive np junctions include reverse biased photosensitive diodes.

4. The isolated signal source of claim 1 wherein:
   the first photosensitive np junction includes a first phototransistor with a base connected to the first amplifier control terminal for generating the isolated photo-control signal as a function of the input signal; and
   the second photosensitive np junction includes a second phototransistor with a base connected to the second amplifier control terminal for generating the isolated photo-feedback signal as a function of the output signal.

5. The isolated signal source of claim 4 and further comprising:
   first and second supply terminals connected across the amplifier;
   a first bias resistor connected between the first amplifier control terminal and the second supply terminal;
   a second bias resistor connected between the second amplifier control terminal and the second supply terminal; and
   wherein the first and second phototransistors each include a collector which is electrically coupled to the first supply terminal.

6. The isolated signal source of claim 5 wherein the first and second resistors have substantially the same resistance values.

7. The isolated signal source of claim 5 wherein the first and second resistors have substantially the same temperature coefficients.

8. The isolated signal source of claim 5 and further comprising a trimmer resistor connected in series with the second bias resistor.

9. The isolated signal source of claim 5 wherein the amplifier is connected to the first and second optical isolators and the first and second bias resistors in a voltage follower configuration having unity gain.

10. An isolated source for providing an output signal as a function of an input signal, the source comprising:
    input terminals configured for receiving an input signal;
    a first optical isolator connected to the input terminals and having a first phototransistor with a base for deriving an isolated control signal on the base as a function of the input signal;
    an amplifier connected to the first optical isolator for supplying the output signal as a function of the isolated control signal and an isolated feedback signal; and
    a second optical isolator connected to the amplifier and having a second phototransistor with a base for deriving the isolated feedback signal on the base as a function of the output signal.

11. The isolated source of claim 10 wherein the amplifier is connected between the first and second optical isolators in a voltage follower configuration with unity gain such that the output signal is substantially equal to the input signal.

12. The isolated source of claim 11 wherein the first and second optical isolators have substantially similar transfer ratios and temperature coefficients.

13. The isolated source of claim 10 wherein:
    the first optical isolator includes a first light-emitting diode connected to the input terminals for receiving the input signal and generating a first infrared signal to energize the first phototransistor; and
    the second optical isolator includes a second light-emitting diode connected to the amplifier for receiving the output signal and generating a second infrared signal to energize the second phototransistor.

14. The isolated source of claim 13 and further comprising:
    first and second supply terminals connected across the amplifier;
    a first bias resistor connected between the base of the first phototransistor for converting the control signal into a control voltage;
    a second bias resistor connected between the base of the second phototransistor for converting the feedback signal into a feedback voltage; and wherein the first and second phototransistors each include a collector which is electrically coupled to the first supply terminal.

15. An isolated current mirror comprising:
first and second supply terminals;
a source for supplying an input current;
an amplifier connected between the first and second supply terminals and having first and second control terminals and an output terminal, wherein the amplifier supplies an output current on the output terminal as a function of an isolated control signal and an isolated feedback signal received on the first and second control terminals, respectively;
a first optocoupler having a light-emitting diode connected in series with the source for receiving the input current and having a phototransistor with a collector connected to the first supply terminal and a base connected to the first amplifier control terminal for providing the isolated control signal to the first amplifier control terminal as a function of the input current;
a first resistor connected between the first amplifier control terminal and the second supply terminal for converting the isolated control signal into a control voltage;
a second optocoupler having a light-emitting diode connected in series with the amplifier output terminal for receiving the output current and having a phototransistor with a collector connected to the first supply terminal and a base connected the second amplifier control terminal for providing the isolated feedback signal to the second amplifier control terminal as a function of the output current; and
a second resistor connected between the second amplifier control terminal and the second supply terminal for converting the isolated feedback signal into a feedback voltage.

16. An isolated signal source for providing an output signal as a function of an input signal, comprising:
a source of the input signal;
a first optical isolator connected to the input signal source for generating a photo-control current through a first photosensitive semiconductor junction as a function of the input signal;
a first bias resistor connected to the first photosensitive semiconductor junction for converting the photo-control current into a control voltage;
an amplifier electrically connected to the first photosensitive semiconductor junction and to the first bias resistor for supplying the output signal as a function of the control voltage and a feedback voltage;
a second optical isolator electrically coupled to the amplifier and having a second photosensitive semiconductor junction for generating a photo-feedback current as a function of the output signal; and
a second bias resistor connected to the second photosensitive semiconductor junction for converting the photo-feedback current into the feedback voltage.

17. The isolated signal source of claim 16 wherein the first and second photosensitive semiconductor junctions include reverse-biased np junctions for generating the photo-control current and the photofeedback current, respectively.

18. The isolated signal source of claim 16 wherein:
the first photosensitive semiconductor junction includes a phototransistor having a collector-base junction for generating the photo-control current as a function of the input signal; and
the second photosensitive semiconductor junction includes a phototransistor having a collector-base junction for generating the photo-feedback current as a function of the output signal.

19. The isolated signal source of claim 18 wherein the collector-base junctions are reverse-biased.

20. An isolated feedback circuit configured for use in an iontophoresis electronic device for monitoring an output current delivered to a patient by the device through at least one electrode pair, the isolated feedback circuit comprising:
means for sensing the delivered output current;
a first optical isolator connected to the means for sensing the delivered output current, which generates an isolated photo-control signal as a function of the delivered output current;
an amplifier electrically coupled to the first optical isolator for supplying an output current feedback signal to the device as a function of the isolated photo-control signal and an isolated photo-feedback signal; and
a second optical isolator electrically coupled to the amplifier, which generates the isolated photo-feedback signal as a function of the output current feedback signal.

21. An iontophoresis controller configured for connection to first and second electrode pairs for controlling infusion of ionic drugs into a patient through the electrode pairs, the controller comprising:
a first electrode driver channel coupled to the first electrode pair for delivering a first output current to the first electrode pair, the first electrode driver channel having a first feedback circuit which monitors the first output current and generates a first output current feedback signal;
wherein the first feedback circuit includes a current mirror comprising: means for sensing the first output current;
a first optical isolator coupled to the means for sensing the first output current, which generates an isolated photo-control signal as a function of the first output current;
an amplifier coupled to the first optical isolator for supplying the first output current feedback signal as a function of the isolated photo-control signal and an isolated photo-feedback signal; and
a second optical isolator coupled to the amplifier, which generates the isolated photo-feedback signal as a function of the first output current feedback signal;
a second electrode driver channel coupled to the second electrode pair for delivering a second output current to the second electrode pair, the second electrode driver channel having a second feedback circuit which monitors the second output current and generates a second output current feedback signal;
an operator interface for selecting operating parameters for the first and second electrode driver channels; and
controller means coupled to the operator interface and the first and second electrode driver channels for controlling operation of the electrode driver channels as a function of the operating parameters and the first and second output current feedback signals.

* * * * *